310-322 SR
XR 3,792,204

United States Patent [11] 3,792,204
Murayama et al. [45] Feb. 12, 1974

[54] ACOUSTIC TRANSDUCER USING A PIEZOELECTRIC POLYVINYLIDENE FLUORIDE RESIN FILM AS THE OSCILLATOR

[75] Inventors: Naohiro Murayama; Takao Okiawa, both of Iwaki, Japan

[73] Assignee: Kureha Kagaku Kogyo Kabushiki Kaisha, Tokyo, Japan

[22] Filed: Dec. 3, 1971

[21] Appl. No.: 204,584

[30] Foreign Application Priority Data

Dec. 4, 1970 Japan ............................ 45-106710

[52] U.S. Cl. ................ 179/110 A, 310/8.2, 310/8.3
[51] Int. Cl. ............................................ H04r 17/00
[58] Field of Search 179/111 R, 111 E, 110 A, 110 F; 307/88 ET; 310/8.2, 8.3

[56] References Cited

UNITED STATES PATENTS

| | | | |
|---|---|---|---|
| 3,607,754 | 9/1971 | Asahina et al. | 307/88 ET |
| 3,612,778 | 10/1971 | Murphy | 307/88 ET |
| 3,278,695 | 10/1966 | Craig et al. | 179/110 A |

FOREIGN PATENTS OR APPLICATIONS

| | | | |
|---|---|---|---|
| 2,000,770 | 9/1969 | France | 310/8.3 |

*Primary Examiner*—Kathleen H. Claffy
*Assistant Examiner*—Thomas L. Kundert
*Attorney, Agent, or Firm*—Sughrue, Rothwell, Mion, Zinn & Macpeak

[57] ABSTRACT

An electrostatic type, electroacoustic transducer having excellent acoustic characteristics is composed of an piezoelectric film of a polyvinylidene fluorine resin having an electroconductive material on the opposite surfaces of the film.

6 Claims, 4 Drawing Figures

ACOUSTIC TRANSDUCER USING A PIEZOELECTRIC POLYVINYLIDENE FLUORIDE RESIN FILM AS THE OSCILLATOR

BACKGROUND OF THE INVENTION

The present invention relates to an electrostatic type, electroacoustic transducer utilizing the piezoelectric effect of a polyvinylidene fluoride resin.

As an electrostatic type speaker, a single oscillator or a push-pull oscillator composed of a plastic film having coated thereon by vacuum evaporation conductive films of a metal or carbon, has hitherto been used in a loud compass or the gamut. Such a type of oscillator requires a considerably higher d.c. voltage as compared with a signal a.c. voltage, and if such a high d.c. voltage is not applied, the oscillator is lacking in the function as required for a speaker. Also, a d.c. voltage source of an amplifier is used as the d.c. bias voltage for the oscillator, but such a system is troublesome in construction of the circuit. Accordingly, although such an oscillator has merit, the use of it as an oscillator for an electrostatic type speaker is limited.

A piezoelectric material is known as an electrostatic type acoustic transducer without the necessity of such a bias voltage, but because the piezoelectric property is concerned with the transformation between an electrical system and a mechanical system, specific plans are required in accordance with the properties of each piezoelectric material and the purpose of using such a piezoelectric material.

As an acoustic transducer employing a piezoelectric polymer film, there is known an acoustic transducer prepared by curving along a diagonal line a quadrilateral film of the piezoelectric polymer in which the direction of the opposite sides is parallel with the direction of orientation of the molecule, fixing both ends of the diagonal line by means of solid materials, supporting the periphery of the quadrilateral film, except the both ends of the diagonal line or only the both ends of another diagonal line of the film, by means of an elastic material, and disposing electrodes at the opposite faces of the film.

From the piezoelectric characteristics of the piezoelectric film used in such a known acoustic transducer, it has been thought that such a piezoelectric film must be a biological high molecular weight material such as a polypeptide, e.g., polymethyl glutamate, collagen, and the like, but such a piezoelectric material has the disadvantages that the piezoelectric property thereof is weak, the specific plans as mentioned above are required for making an acoustic transducer from such a material, and also a sufficient compass is not obtained even applying such specific plans. Furthermore, it is difficult owing to such specific plans to obtain practical acoustic characteristics.

SUMMARY OF THE INVENTION

Therefore, an object of this invention is to provide a sound-electricity and electricity-sound transducer, which has excellent acoustic characteristics different from those of conventional ones, can be prepared by a very simple method, and has a large utility value, using an electret of a vinylidene fluoride resin film as the vibrator or oscillator.

On the one hand, the term "electret" in its broad meaning denotes "a dielectric body with a permanent dielectric volume polarization" as has been defined by Oliver Heaviside, designating all substances in which polarization takes place, including ferroelectric substances. On the other hand, the term "electret" in its narrow meaning denotes a substance having permanent surface charges due to surface polarization in particular among electrets in the broad meaning. The term "electret" used in the specification of the present invention means exclusively the electret in the broad meaning according to the former definition.

In the electrostatic type acoustic transducer of this invention, the aforesaid faults are overcome because no bias voltage is necessary in this invention, and also a sufficient sound pressure and excellent acoustic characteristics are obtained by using vinylidene fluoride film as the piezoelectric film.

The vinylidene fluoride resin in accordance with this invention includes polyvinylidene fluoride and copolymers of a vinylidene fluoride monomer and at least one other monomer.

Thus, according to the present invention, there is provided an acoustic transducer composed of an piezoelectric film made of the vinylidene fluoride resin film, the whole periphery of the film being fixed in a definite shape, having disposed on the opposite faces thereof electrodes having a definite shape, the electrodes as terminals forming a sound-electric current circuit.

The piezoelectric film of the vinylidene fluoride resin is obtained from the vinylidene fluoride resin and the material has a high piezoelectric constant.

The piezoelectric of the vinylidene fluoride resin is obtained by applying a d.c. potential, in the direction of the thickness of the vinylidene fluoride film, to the film while heating the film, and then cooling the film to room temperature while applying the d.c. potential. For example, the piezoelectric prepared at a temperature of 150°C. and 300 kv./cm. in d.c. voltage from a film obtained by pressing a polyvinylidene fluoride powder, has a piezoelectric constant of $3 \times 10^{-8}$c.g.s., e.s.u. since the film had not been oriented and has no anisotropy, the piezoelectric thus obtained could be sufficiently used for the purpose of this invention.

Also, piezoelectric film having excellent piezoelectric properties can be prepared from vinylidene fluoride copolymers. For example, piezoelectric film prepared under the conditions of 135°C. in temperature and 230 kv./cm. in d.c. voltage from the film obtained by pressing the powder of a copolymer of vinylidene fluoride and tetrafluoroethylene (80:20), had a piezoelectric constant of $4 \times 10^{-7}$c.g.s., e.s.u.

DESCRIPTION OF THE PREFERRED EMBODIMENTS

Figure 1:
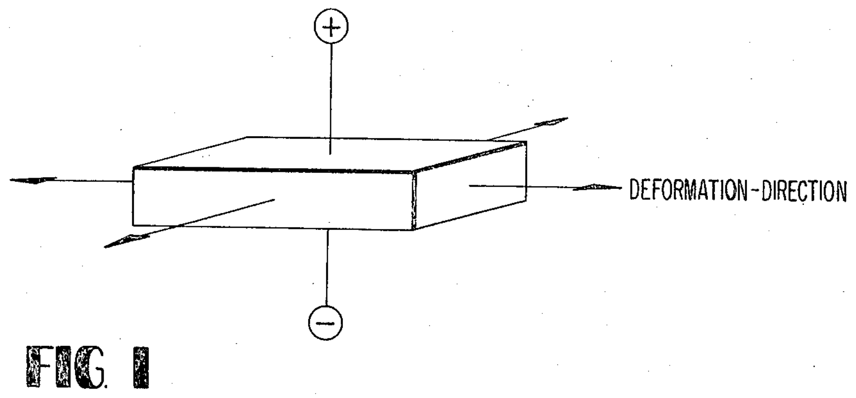
FIG. 1 is a schematic view in perspective showing the piezoelectric effect formed in the piezoelectric film of the non-oriented polyvinylidene fluoride resin film, in accordance with the present invention.
Figure 2:
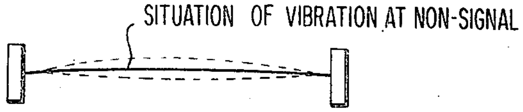
FIG. 2 is a schematic view showing a principle of an acoustic transducer utilizing the piezoelectric effect shown in FIG. 1, in which the deformed states of the film are shown by dotted lines.

As shown in FIG. 1 of the accompanying drawing, the piezoelectric properties formed remarkably in the electret of the vinylidene fluoride resin film are that the deformation direction of the electret film is vertical or transverse to the thickness direction and the direction of the electric current formed is parallel to the thickness direction of the film, and there is no anisotropy in the film plane. Also, FIG. 1 shows that when an a.c. voltage is applied to the film in the thickness direction thereof, the film is deformed in the directions shown by the arrows. Thus, if the piezoelectric film is fixed at the opposite sides thereof with a suitable curvature and an a.c. voltage is applied to the film in the thickness direction to cause the deformation as mentioned above, the film vibrates as shown by the dotted lines in FIG. 2, which produces an electricity-sound transducer.

On the other hand, if a sound wave is applied to the film in the direction of the arrows shown in FIG. 1 and an a.c. voltage generated by the piezoelectric effect is withdrawn, the system gives a sound-electricity transducer.

Therefore, the acoustic transducer of this invention using the piezoelectric film of the vinylidene fluoride resin as the vibrator or oscillator may be made by fixing the entire periphery of the piezoelectric film in the same manner as mentioned above. Thus, the structure of the acoustic transducer of this invention is quite simple.

In a conventional acoustic transducer using polypeptide or a biological polymer as the vibrator or oscillator, polymethyl glutamate is usually used as the vibrator. However, the piezoelectric effect formed in polymethyl glutamate is a shear formed in the plane perpendicular to the direction of the application of the a.c. voltage and when the angle between the direction of the orientation and the direction of the stress is 45°, the most effective conversion efficiency is obtained. Thus, when such a material is used as the vibrator or oscillator for an acoustic transducer, the specific structures as mentioned above are required. Accordingly, it is impossible to generate the necessary vibration of the film for an acoustic transducer when the periphery of the film is fixed as in this invention.

The piezoelectric film of the vinylidene fluoride resin and the acoustic transducer of this invention using such a piezoelectric film are quite different from such conventional transducers, which is the main feature of this invention.

That is, when a d.c. field is applied to the piezoelectric film of the non-oriented vinylidene fluoride resin film, the direction of the deformation is isotropic in the plane and thus when the entire periphery of the film is uniformly supported or fixed, a shrinkage cancelling the displacement of the film is not formed, when the film elongates to one direction, by the elongation. Therefore, in the present invention, an acoustic transducer can be obtained by uniformly fixing the entire periphery of the film.

Also, in a piezoelectric film of an oriented vinylidene fluoride resin film, the direction of deformation is maximum in the direction of the orientation but a deformation occurs also in the direction perpendicular to the orientation direction and hence the oriented vinylidene fluoride resin film is same as the non-oriented vinylidene fluoride resin film in regard to the phases of the both deformations.

That is, when a piezoelectric film is formed from a vinylidene fluoride resin film having the molecular chains oriented by stretching, the piezoelectric property generated in the piezoelectric film in anisotropic in the plane of the film, that is, when the direction of the application of an a.c. field is perpendicular to the plane of the film, the direction of the deformation of the film caused by the piezoelectric effect is mainly parallel with the direction of the orientation.

However, the piezoelectric constant obtained by measuring the polarization formed on the surface of the film when a stress is applied to the direction of the orientation of the film is very large.

For example, when a piezoelectric film was prepared by applying a d.c. voltage of 700 kv./cm. at 90°C. for one hour to a vinylidene fluoride resin film monoaxially stretched 2.3 times at 25°C. and then the temperature was reduced to room temperature in that state, the piezoelectric constant of the piezoelectric film reached $10^{-6}$c.g.s., e.s.u., which is far higher than that of the piezoelectric film of the non-stretched vinylidene fluoride resin film.

Also, when piezoelectric film is prepared from the stretched vinylidene fluoride resin film even under considerably low temperature and voltage, it shows a considerably good piezoelectric constant. For example, the piezoelectric constant of the electret prepared under the conditions of 50°C. and 300 kv./cm. was $3 \times 10^{-7}$c.g.s., e.s.u.

Thus, when an a.c. field is applied to the opposite surfaces of piezoelectric film prepared from the oriented or stretched vinylidene fluoride resin film, the deformation occurs in the direction parallel with the direction of the orientation as well as the direction perpendicular to the direction of the orientation and the phase of the former is same as the phase of the latter.

Therefore, when a piezoelectric film of the oriented vinylidene fluoride resin film is used as the vibrator or oscillator, an excellent acoustic transducer, as the aforesaid acoustic transducer made by using the piezoelectric film of the non-oriented vinylidene fluoride resin film, is obtained by fixing the vibrator with proper care and planning.

In the acoustic transducer based on the principle described above, the shape of the electrode and the shape of the vibrator or oscillator may be selected desirably. That is, in conventional acoustic transducers, the shape of the vibrators or oscillators is generally a disc form owing to the complicated structure thereof or an ellipse in a specific case of improving the characteristics in a low compass, or in a rare case of a conventional acoustic transducer, specific shape of vibrator or oscillator is employed, althouth the structure of the device may be relatively simple. On the other hand, in the acoustic transducer of this invention, any desired shape of the vibrator or oscillator, such as disc, ellipse, polygon as well as a complicated shape may be employed. For example, by employing the vibrator of a shape of a resonance box of a string music instrument, the acoustic characteristics of the acoustic transducer can be improved and further the thickness of the acoustic transducer can be reduced to 10 mm.

Moreover, by employing a cylindrical vibrator or oscillator fixed at the upper and lower ends by disc-shape fixing members or a spherical vibrator or an oscillator fixed at a lower portion, an acoustic transducer showing no directivity can be obtained. Also, the acoustic transducer of this invention can be utilized as a driver for a phone speaker and also the acoustic transducer having the same structure can be used as a head phone.

As mentioned above, a reversible transducer between an electric system and a sound system can be obtained by fixing the ends of the piezoelectric made of the vinylidene fluoride resin film, and the structure of the transducer thus obtained is quite simple as compared with those of conventional microphones, speakers, etc., and thus the article of this invention can be produced very easily and with a low cost.

The a.c. signals for the acoustic transducer of this invention may be supplied directly from the plate circuit of a power tube of an amplifier, or may be applied through an out-put transformer at the secondary side of a main out-put transformer.

The features of this invention can be exhibited most remarkably in case of employing the piezoelectric film of the vinylidene fluoride resin film having no anisotropy, but in the case of the piezoelectric film of the anisotropic vinylidene fluoride resin film, the piezoelectric property thereof is fundamentally the same as that of the above case, or in the latter case the piezoelectric property is only different in directions in the film plane and thus by properly planning the construction of the acoustic transducer, almost the same effect as in the former case can be obtained.

The following examples are intended to further illustrate the present invention for a better understanding thereof, but not intended to limit the invention in any way.

EXAMPLE 1

A powder of polyvinylidene fluoride was fabricated into a sheet having a thickness of 0.1 mm. by means of a T-type die, and the opposite surfaces of the sheet were vacuum-coated with aluminum. The vacuum-coated portions served as the electrodes for making the piezoelectric film and also as the electrodes in case of using the piezoelectric film as the vibrator or oscillator of a head phone, and were in the form of disc having a diameter of 10 cm.

The sheet was maintained in 150°C. for 30 minutes while applying thereto a d.c. voltage of 300 kv./cm., and then cooled to room temperature while applying the d.c. voltage to provide an piezoelectric sheet of polyvinylidene fluoride having a high piezoelectric property, which could be used as a vibrator or oscillator for a head phone. The structure of the head phone made by using the piezoelectric sheet is shown in FIG. 3 of the accompanying drawings.

Figure 3:
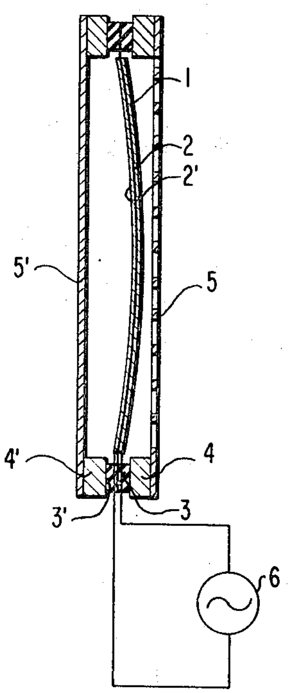
FIG. 3 is an elevational view of a head horn using the piezoelectric of the vinylidene fluoride resin film as the oscillator in accordance with this invention.

Thus, in FIG. 3, there is shown a vibrator or oscillator 1 composed of the piezoelectric sheet of polyvinylidene fluoride having vacuum coated on the opposite surfaces thereof aluminum electrodes 2 and 2'. In this example, aluminum was used as the conductive material but other conductive materials such as silver, gold, etc., may also be used.

The vibrator or oscillator 1 may be completely fixed by fixing members 3 and 3' or supported elastically. In this example, a hypalon rubber support was used. The vibrator system 1, 2. 2', 3 and 3' are supported by rings 4 and 4'. Protecting plates 5 and 5' for the vibrator are disposed as shown in FIG. 3, and each of the plates has many holes each having a diameter of 2 mm. The conductive layers 2 and 2' are connected to an a.c. signal source 6. In this example, another out-put transformer (TANGO U-608) from the a.c. signal source 6 was used for impedance conversion and the signal was supplied to the head phone through the transformer.

Figure 4:
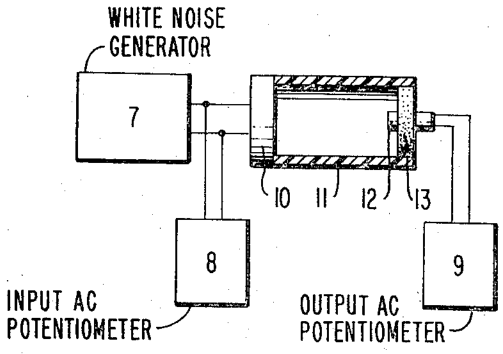
FIG. 4 is a schematic view showing a means of testing the properties of the head phone of the structure shown in FIG. 3.

The properties of the head phone were detected by means of the device shown in FIG. 4. That is, a definite input potential was applied to the head phone to be detected by means of a noise generator, and then the output voltage was measured when the input potential was received by a condensor microphone. Also, the output voltage was measured by using a commercially available head phone and the result was compared with that of the above case.

In FIG. 4, the numeral 7 is a white noise generator, the numeral 8 is an a.c. potentiometer for measuring the input potential of the head phone, and the numeral 9 is an a.c. potentiometer for measuring the output potential from the microphone. The head phone 10 was connected to a coupler 11 (polyvinyl chloride pipe) having a diameter of 90 mm. and a length of 25 mm. via a packing for preventing air from leaking. As a condenser microphone 12, a Sony ECH-21 type was used in this example.

The numeral 13 is a sound absorber made of a glass fiber felt. The distance between the head phone and the microphone was 15 cm. When the input potential to the head phone was 1 volt, the output potential from the head phone of this invention was 2.5 millivolts.

As the comparison test, a head phone, PIONEER SE-20, was used and the output potential obtained through the head phone was 7.5 millivolts.

By the above results, it will be understood that the head phone of this invention can be practically used.

EXAMPLE 2

A powder of polyvinylidene fluoride was fabricated into a sheet having a thickness of 0.2 mm. by means of an extruder. The sheet was brought into contact with a roll and, by local heating at the contact portion, the sheet was stretched to four times. The temperature of the sheet under such stretching was 110°C.

To the opposite surfaces of the sheet were applied, by vacuum evaporation, alumnium circular layers of 10 cm. in diameter. After maintaining the sheet at 90°C. for 30 minutes while applying a d.c. voltage of 400 kv./cm., the sheet was cooled to room temperature while applying the d.c. voltage to provide a piezoelectric sheet. By using the sheet as the vibrator or oscillator, a head phone was prepared by the same way as in Example 1. The results of conducting the measurement as in Example 1 showed that when the input potential of the head phone was one volt, the output potential was 3.1 millivolts.

EXAMPLE 3

A powder of a copolymer of vinylidene fluoride and tetrafluoroethylene in a ratio of 80 to 20 prepared by a suspension copolymerization was press-molded into a sheet of 0.1 mm. in thickness. To the opposite surfaces of the sheet were applied, by vacuum evaporation, circular aluminum layers having a diameter of 10 cm., and after maintaining the sheet at 135°C. for 30 minutes while applying a d.c. voltage of 230 kv./cm., the sheet was cooled to room temperature while applying the d.c. voltage, whereby a piezoelectric film was obtained. By using the piezoelectric film as the vibrator or oscillator, a head phone was prepared by the same way as in Example 1. When the same measurement as in Example 1 was conducted with the head phone, the results showed that when an input potential to the head phone was one volt, the output potential was 4.0 millivolts.

EXAMPLE 4

Because the head phone prepared in Example 1 is a reversible electroacoustic transducer, it was used as a microphone and the properties of it were detected. The vibrator was vibrated by applying sounds to the microphone and the electric current generated by the vibration was withdrawn from the electrodes.

The impedance of the output was converted through an FET circuit. When the microphone was connected to a commercially available tape recorder as a high impedance microphone followed by recording, good results were obtained.

What is claimed is:

1. An electrostatic type acoustic transducer having a piezoelectric film as a vibrator or oscillator, said film being a vinylidene fluoride resin film prepared by subjecting said film to a d.c. voltage of 100 kv./cm. to 1,500 kv./cm. at a termperature of 40° to 180°C., said film having on the opposite surfaces thereof a conductive material, said vibrator or oscillator being fixed in a desired shape at the entire periphery thereof, and the ends of said conductive layers forming a sound-electric current circuit.

2. The electrostatic type acoustic transducer as claimed in claim 1 wherein said vinylidene fluoride resin is polyvinylidene fluoride.

3. The electrostatic type acoustic transducer as claimed in claim 1 wherein said vinylidene fluoride resin is a copolymer of vinylidene fluoride and tetrafluoroethylene.

4. The electrostatic type acoustic transducer as claimed in claim 1 wherein the film of said vinylidene fluoride is non-oriented.

5. The electrostatic type acoustic transducer as claimed in claim 1 wherein the film of said vinylidene fluoride resin is oriented.

6. The electrostatic type acoustic transducer as claimed in claim 1 wherein said conductive material is aluminum.

* * * * *